US010389366B2

(12) United States Patent
Hailu et al.

(10) Patent No.: US 10,389,366 B2
(45) Date of Patent: Aug. 20, 2019

(54) SERDES WITH ADAPTIVE CLOCK DATA RECOVERY

(71) Applicant: QUALCOMM Incorporated, San Diego, CA (US)

(72) Inventors: Eskinder Hailu, Cary, NC (US); Bupesh Pandita, Raleigh, NC (US); Jon Boyette, Holly Springs, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/017,308

(22) Filed: Jun. 25, 2018

(65) Prior Publication Data

US 2019/0007053 A1 Jan. 3, 2019

Related U.S. Application Data

(60) Provisional application No. 62/526,831, filed on Jun. 29, 2017.

(51) Int. Cl.
| | |
|---|---|
| *H03L 7/08* | (2006.01) |
| *H04B 1/16* | (2006.01) |
| *H03M 9/00* | (2006.01) |
| *H03L 7/095* | (2006.01) |
| *H03L 7/081* | (2006.01) |
| *H04L 7/033* | (2006.01) |

(52) U.S. Cl.
CPC .......... *H03L 7/0807* (2013.01); *H03L 7/0802* (2013.01); *H03L 7/0812* (2013.01); *H03L 7/095* (2013.01); *H03M 9/00* (2013.01); *H04B 1/16* (2013.01); *H04L 7/033* (2013.01)

(58) Field of Classification Search
CPC ..... H03L 7/095; H03L 7/0998; H03L 7/0992; H03L 7/0807; H04L 7/033
See application file for complete search history.

(56) References Cited

U.S. PATENT DOCUMENTS

| 6,005,904 | A | * | 12/1999 | Knapp | ...................... | H03L 7/06 |
| | | | | | | 327/159 |
| 6,744,323 | B1 | * | 6/2004 | Moyal | ...................... | H03L 7/10 |
| | | | | | | 331/1 A |
| 8,415,996 | B1 | * | 4/2013 | Wong | .................... | H03L 7/0807 |
| | | | | | | 327/152 |
| 9,208,130 | B1 | | 12/2015 | Chen et al. | | |
| 10,014,868 | B1 | * | 7/2018 | Raj | ........................... | H04L 7/00 |
| 10,079,607 | B1 | * | 9/2018 | Grens | .................... | H03L 7/099 |
| 2006/0133466 | A1 | | 6/2006 | Palmer et al. | | |
| 2007/0047683 | A1 | * | 3/2007 | Okamura | .............. | H03L 7/0814 |
| | | | | | | 375/355 |
| 2008/0205570 | A1 | * | 8/2008 | Baumgartner | ........ | H03L 7/0812 |
| | | | | | | 375/376 |

(Continued)

OTHER PUBLICATIONS

International Search Report and Written Opinion—PCT/US2018/039607—ISA/EPO—dated Oct. 24, 2018.

*Primary Examiner* — Aristocratis Fotakis
(74) *Attorney, Agent, or Firm* — Haynes and Boone, LLP (36340)

(57) ABSTRACT

A gear-shifting serializer-deserializer (SerDes) is provided that uses a first divisor value to form a divided clock while de-serializing a serial data stream prior to a lock detection and that uses a second divisor value to form the divided clock value after the lock detection, wherein the second divisor value is greater than the first divisor value.

18 Claims, 3 Drawing Sheets

(56) References Cited

U.S. PATENT DOCUMENTS

| | | |
|---|---|---|
| 2009/0296867 A1 | 12/2009 | Do et al. |
| 2011/0064176 A1* | 3/2011 | Takada ............... H03L 7/07 |
| | | 375/355 |
| 2012/0194235 A1* | 8/2012 | Subburaj ............ H03K 23/667 |
| | | 327/156 |
| 2013/0003907 A1* | 1/2013 | Wenske ............... H04L 7/033 |
| | | 375/373 |
| 2015/0198966 A1* | 7/2015 | Lee .................... G06F 1/08 |
| | | 713/501 |
| 2015/0229298 A1 | 8/2015 | Tomita et al. |

* cited by examiner

SERDES WITH ADAPTIVE CLOCK DATA RECOVERY

CROSS-REFERENCE TO RELATED APPLICATION

This application claims the benefit of and priority to U.S. Provisional Application No. 62/526,831 filed Jun. 29, 2017, the content of which is hereby incorporated by reference.

TECHNICAL FIELD

This application relates to a serializer-deserializer (SerDes), and more particularly, to a SerDes with adaptive clock data recovery.

BACKGROUND

Transmission of multi-bit words typically occurs over multi-wire buses. For example, an eight-bit word may be transmitted over a bus having eight wires, one wire for each bit. But in such conventional busses, each bit carried on a given wire is independent of the remaining bits. As the data rates increase, the resulting signaling becomes problematic in that the various bits in a transmitted word become skewed from each other as the word propagates over the bus.

Given the issues with skew between multiple bits in high-speed communication, various serializer/deserializer (SerDes) systems have been developed. A SerDes transmitter serializes a multi-bit word into a serial data stream of corresponding bits. There can then be no such skew between adjacent bits on a multi-wire bus since the serial data stream is carried over a single transmission line (which may be differential). A SerDes receiver deserializes the received serial data stream into the original multi-bit word. In some SerDes systems, a clock signal is not transmitted separately from the serial data stream such that the clock signal is instead embedded in the serial data stream. A SerDes receiver for an embedded clock protocol thus includes a clock data recovery (CDR) circuit that recovers a recovered clock signal from the binary transitions in the received serial data stream. However, a CDR circuit is not limited to embedded clock systems but may be also included in SerDes receivers for source synchronous systems in which the serial data stream is transmitted in parallel with a clock signal. Although the clock signal does not need to be recovered from the data in a source synchronous protocol, a CDR circuit in a source synchronous system aligns the received clock with the serial data stream to produce a recovered clock signal so that the received data may be properly sampled responsive to the recovered clock signal.

To save power, it is conventional to periodically disable the CDR circuit. The CDR circuit thus only functions during the periods in which it is enabled. In an ideal operation, the on-time duration for the CDR circuit would depend upon the process, voltage, and temperature (PVT) corner for the corresponding integrated circuit in which the SerDes is implemented. But such PVT-aware CDR periodicity is difficult to implement and requires on-chip thermal sensors.

There is thus a need in the art for CDR circuits with reduced power consumption.

SUMMARY

A clock data recovery (CDR) circuit is disclosed for a SerDes receiver for both source synchronous and embedded clock protocols. In both protocols, the CDR circuit functions to filter the phase difference between binary transitions of a sampling clock signal and corresponding binary transitions in a received serial data stream to produce a filtered phase difference. A mixer mixes (phase interpolates) an input clock signal responsive to the filtered phase difference to form the sampling clock signal. The sampling clock signal is phase aligned by the phase interpolation to be centered within the data eye for the received serial data stream so that the received serial data stream may be accurately sampled by the sampling clock signal in a de-serializer. For an embedded clock implementation, a clock recovery circuit retrieves the input clock signal from the received serial data stream responsive to the binary transitions of the received serial data stream. In a source synchronous implementation, the input clock signal is received in parallel with the received serial data stream.

To reduce power consumption by the SerDes receiver, a clock divider divides the sampling clock signal by an adjustable divisor to form a divided clock signal. A phase detector determines the phase difference between the sampling clock signal and the received serial data stream by determining the phase difference between the divided clock signal and the received serial data stream. A CDR lock detector receives a phase detector output signal from the phase detector in the SerDes receiver to determine whether the sampling clock signal is locked (properly aligned with the data eye) to the received serial data stream. With regard to the phase difference determination, the phase detector compares the divided clock signal to the received serial data stream to determine whether clock edges in the divided clock signal lead or lag the corresponding binary transitions in the received serial data stream. For example, the phase detector signal may be formed as an up signal and a down signal. The phase detector asserts the up signal when the divided clock signal is lagging. Conversely, the phase detector asserts the down signal when the divided clock signal is leading. The loop filter filters the phase detector output signal to produce the filtered phase difference so that the mixer either increases or decreases the frequency and/or phase of the sampling clock signal as appropriate so that the sampling clock signal is centered with the data eye. In particular, if the phase detector output signal indicates that the sampling clock signal is lagging the serial data stream, the filtered phase difference forces the mixer to increase the frequency of the sampling clock signal. Conversely, if the phase detector output signal indicates that the sampling clock signal is leading the serial data stream, the filtered phase difference forces the mixer to decrease the frequency and/or phase of the sampling clock signal.

The clock data recovery lock detection circuit examines the phase detector output signal to determine whether the sampling clock signal is synchronized with the received serial data stream. If the determination is positive, the clock data recovery lock detection circuit asserts the lock signal. Prior to the assertion of the lock signal, the adjustable divisor has a first value. A selection circuit is configured to respond to the lock signal assertion by increasing the adjustable divisor to have a second value greater than the first value. The phase detector thus consumes less power after lock is achieved since the frequency of the divided clock signal is reduced by the increase of the adjustable divisor after lock is achieved.

These and other advantageous features may be better appreciated through the following detailed description.

DETAILED DESCRIPTION

To reduce power consumption after lock is achieved, a SerDes receiver includes a clock divider for dividing a sampling clock signal by an adjustable divisor to form a divided clock signal. A phase detector compares the divided clock signal to a received serial data stream to form a phase detector output signal that indicates whether the divided clock signal (and thus also the sampling clock signal) is leading or lagging in phase with respect to the received serial data stream.

The SerDes receiver functions slightly differently depending upon whether the system is source synchronous or whether an input clock signal is embedded within the serial data stream. In a source synchronous system, the input clock signal is transmitted in parallel with the serial data stream. A mixer produces the sampling clock signal through phase interpolation (phase shifting) by using a filtered phase difference between the divided clock signal and the received serial data stream as an interpolation control. A de-serializer samples the received serial data stream responsive to the sampling clock signal to form a parallel data output stream accordingly. Since the input clock signal is not embedded with the serial data stream in a source synchronous system, the SerDes receiver functions to adjust the phase and/or frequency of the sampling clock signal responsive to the filtered phase difference such that a phase detector output signal indicates that the sampling clock signal is phase aligned with a desired sampling point in a data eye for the received serial data stream. In an embedded clock implementation, the SerDes receiver includes a clock recovery circuit that functions to retrieve the input clock signal responsive to binary transitions in the received serial data stream. A source synchronous implementation will be discussed first followed by a discussion of an embedded clock implementation.

Figure 1A:
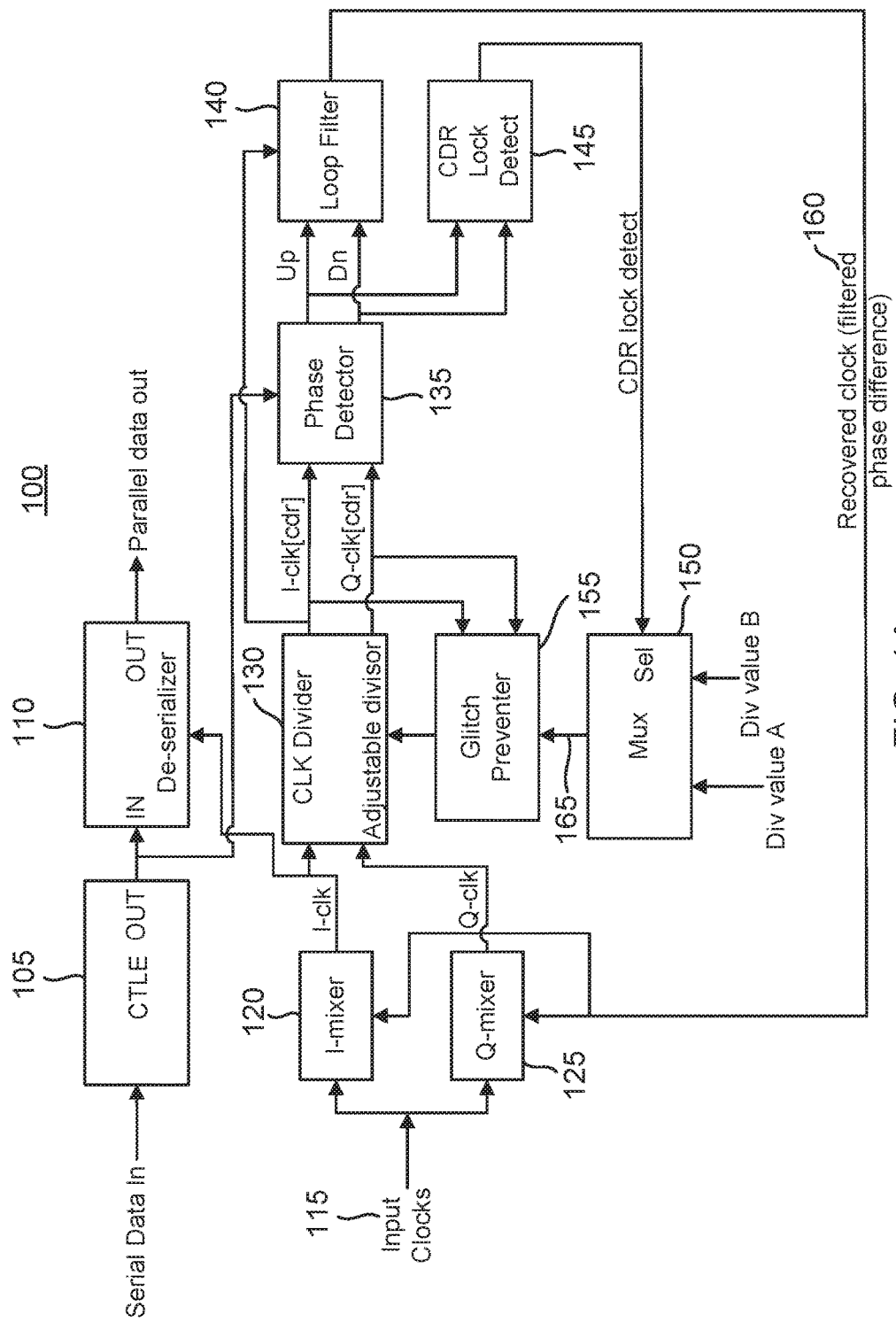
FIG. 1A is a block diagram of an example source synchronous SerDes receiver including a clock divider that is controlled to divide the sampling clock signal with a first divisor prior to achieving lock with a received serial data stream and to divide the sampling clock signal with a second divisor that is greater than the first divisor after achieving lock in accordance with an aspect of the disclosure.

An example source synchronous SerDes receiver 100 is shown in FIG. 1A. The received serial data stream is equalized in a continuous time linear equalizer (CTLE) 105 to produce an equalized received serial data stream. It will be appreciated that alternative equalization schemes (or no equalization) may be implemented in alternative implementations. An input clock signal 115 includes an in-phase input clock signal and also a quadrature input clock signal. An in-phase mixer 120 (I-mixer) phase shifts the in-phase input clock signal to form a sampling clock signal (I-clk) responsive to an interpolation according to a filtered phase difference 160. Similarly, a quadrature mixer 125 (Q-mixer) phase shifts the quadrature input clock signal responsive to filtered phase difference 160 to produce a quadrature sampling clock signal (Q-clk). A de-serializer 110 samples the equalized serial data stream from CTLE 105 responsive to the sampling clock signal to produce a parallel received data output stream. The phase shifting in I-mixer 120 thus aligns the sampling clock signal to be suitably within the data eye for the equalized serial data stream.

A clock divider 130 divides the I and Q versions of the sampling clock signal according to an adjustable divisor 165 to form a divided clock signal (in both I and Q forms also). Note that the quadrature clock path is optional and may be deleted in alternative implementations. Adjustable divisor 165 has at least a first divisor value (designated as Div value A) and a second divisor value (designated as Div value B). A selector circuit such as a multiplexer (Mux) 150 selects between the first and second divisor values to form adjustable divisor 165. A glitch preventer circuit 155 filters adjustable divisor 165 to prevent glitches such as runt pulses being formed in the divided I and Q signals from clock divider 130. Adjustable divisor 165 used by clock divider 130 as filtered by glitch preventer circuit 155 thus equals either the first divisor or the second divisor depending upon the selection by multiplexer 150.

A phase detector 135 compares the I and Q divided clocks to the equalized received serial data stream to form a phase detector output signal such as an UP signal and a down (DN) signal as known in the phase detector arts. A CDR lock detector 145 processes the UP and DN signals to determine whether the I and Q divided clock signals are locked with the equalized received serial data stream. For example, CDR lock detector 145 may be configured to detect a lock and thus assert a CDR lock detect output signal when the UP signal is asserted on average as much as the DN signal is asserted during a detection period. The detection period (which may also be denoted as an averaging time window) as well as an error threshold for detection may be fixed or programmable. For example, CDR lock detector 145 may be configured to detect a lock if the absolute value of (average (UP)−average (DN)) is less than the error threshold. Phase detector 135 asserts the UP signal when rising and/or falling edges for the divided clock signals are lagging the corresponding edges for the equalized received serial data stream. Similarly, phase detector 135 asserts the DN signal when rising and/or falling edges for the divided clock signals are leading the corresponding edges for the equalized received serial data stream.

Prior to a lock detection by CDR lock detector 145, multiplexer 150 forces clock divider 130 to divide with the smaller divisor value (e.g., Div value A) by setting adjustable divisor 165 accordingly. After a lock detection, CDR lock detector 145 asserts the CDR lock detect output signal. Multiplexer 150 responds to the assertion of the CDR lock detect output signal by forcing clock divider 130 to divide with the greater divisor value (e.g., Div value B) by setting adjustable divisor accordingly. It will be appreciated that this greater divisor value may be made adaptive in alternative implementations such that source synchronous SerDes receiver 100 would function to increase the divisor value so long as lock is maintained to maximize the power savings. In such an implementation, multiplexer 150 may then select for more than just two possible divisor values. For example, a first divisor value may equal 4 such that a 10 GHz received clock is divided down into a 2.5 GHz divided clock. After lock is achieved with the 2.5 GHz divided clock, a second divisor value such as 8 may be selected such that the 10 GHz received clock is divided down into a 1.25 GHz divided clock. Even greater divisor values may then be selected for by multiplexer 150 so long as lock is maintained.

Regardless of how many divisor values a given implementation for source synchronous SerDes receiver 100 uses, note the advantageous power consumption reduction by phase detector 135 when it compares a slower version of the divided clocks to the equalized received serial data stream following a lock to the received serial data stream. Source synchronous SerDes receiver 100 may thus be denoted as a "gear shifting" SerDes receiver in that the clock division may be deemed to shift into a higher gear by using an increased divisor value. A loop filter 140 filters the up and down signals from phase detector 135 to form filtered phase difference 160. Since I-mixer 120 phase shifts the I version of input clock signal 115 so that the sampling clock signal is positioned appropriately (e.g., centered) within the data eye for the equalized serial data stream, filtered phase difference 160 may be deemed to comprise a "recovered clock signal" in that phase detector 135, loop filter 140, and I-mixer 120 function as a source synchronous CDR circuit to keep the sampling clock positioned appropriately within the data eye.

Figure 1B:
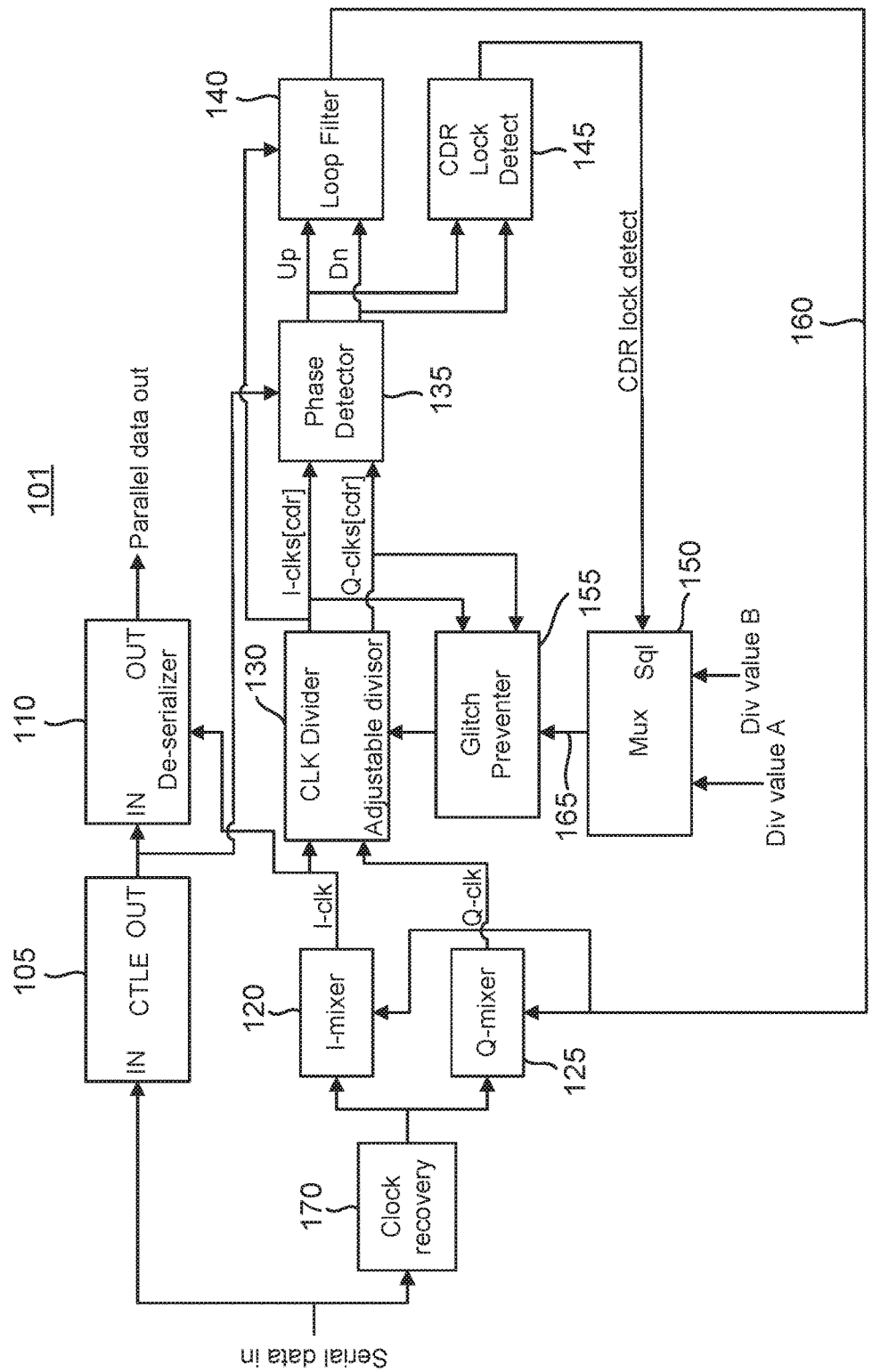
FIG. 1B is a block diagram of an example embedded clock SerDes receiver including a clock divider that is controlled to divide the sampling clock signal with a first divisor prior to achieving lock with a received serial data stream and to divide the sampling clock signal with a second divisor that is greater than the first divisor after achieving lock in accordance with an aspect of the disclosure.

An embedded clock SerDes receiver 101 is shown in FIG. 1B. Equalizer 105, de-serializer 110, I-mixer 120, Q-mixer 125, clock divider 130, phase detector 135, loop filter 140, lock detector 145, multiplexer 150, and glitch preventer 155 all function as discussed with regard to source synchronous SerDes receiver 100. However, the input clock that drives I-mixer 120 and Q-mixer 125 is recovered from the serial data stream (serial data in) by a clock recovery circuit 170 as known in the clock data recovery arts. It thus doesn't matter whether a SerDes receiver runs according to a source synchronous or an embedded clock protocol because both implementations enjoy the power savings of the gear shifting SerDes disclosed herein.

In one implementation, multiplexer 150 may be deemed to comprise a means for adjusting the adjustable divisor to equal a first divisor responsive to the divided clock signal not being locked with the serial data stream and for adjusting the adjustable divisor to equal a second divisor responsive to the divided clock signal being locked to the serial data stream.

Figure 2:
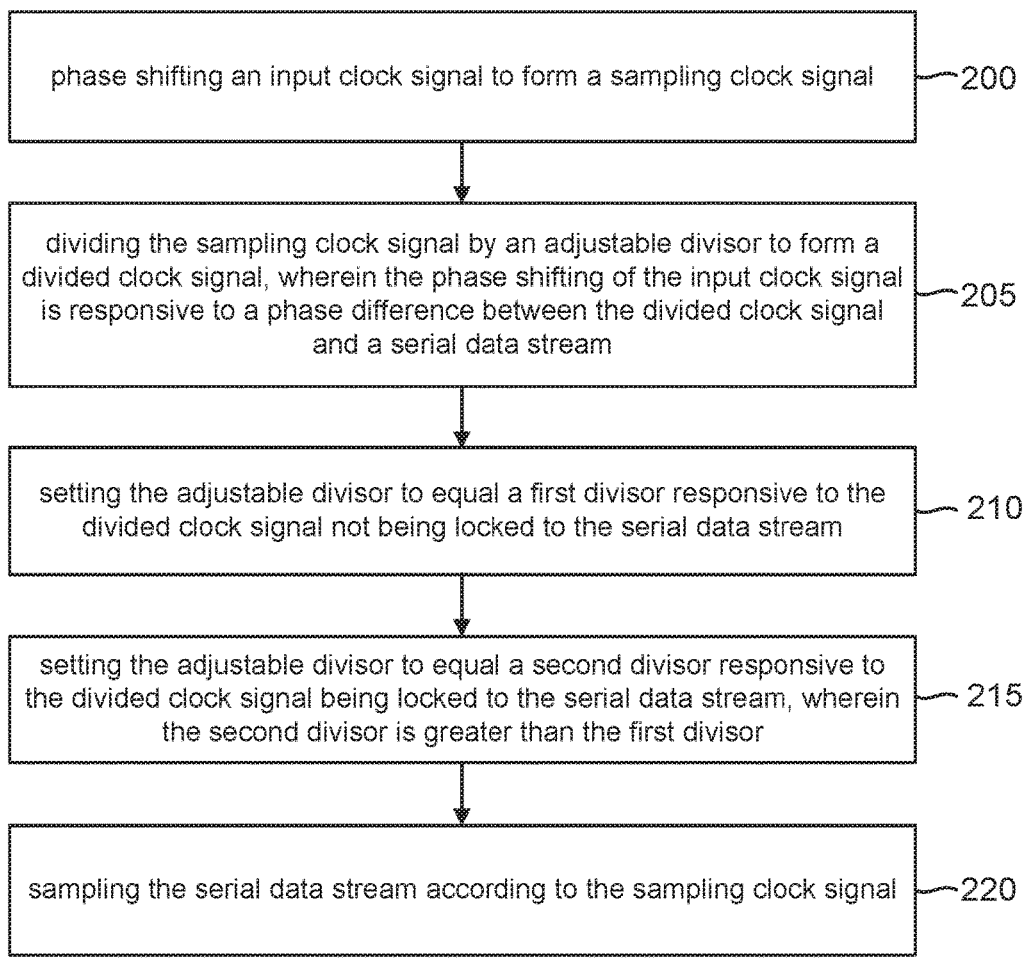
FIG. 2 is a flowchart for a method of receiving a serial data stream in which a sampling clock signal is divided with an adjustable divisor in accordance with an aspect of the disclosure.

An example method of receiving a serial data stream using a gear-shifting SerDes will now be discussed with regard to the flowchart of FIG. 2. The method includes an act 200 of phase shifting an input clock signal to form a sampling clock signal. The phase shifting by I-mixer 120 is an example of act 200. The method further includes an act 205 of dividing the sampling clock signal by an adjustable divisor to form a divided clock signal, wherein the phase shifting of the input clock signal is responsive to a phase difference between the divided clock signal and a serial data stream. The division by clock divider 130 and the production of filtered phase difference 160 by phase detector 135 and loop filter 140 is an example of act 205. The method further includes an act 210 of setting the adjustable divisor to equal a first divisor responsive to the divided clock signal not being locked to the serial data stream. The setting of the adjustable divisor by multiplexer 150 while the CDR lock detect output signal is not asserted is an example of act 210. In addition, the method includes an act 215 of setting the adjustable divisor to equal a second divisor responsive to the divided clock signal being locked to the serial data stream, wherein the second divisor is greater than the first divisor. The setting of the adjustable divisor by multiplexer 150 while the CDR lock detect output signal is asserted is an example of act 215. Finally, the method includes an act 220 of sampling the serial data stream according to the sampling clock signal to form a parallel data output stream. The action of de-serializer 110 is an example of act 220.

It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:
1. A receiver, comprising;
a mixer configured to phase shift an input clock signal to form a sampling clock signal;
a de-serializer configured to sample a serial data stream responsive to the sampling clock signal to form a parallel output data stream;
a clock divider configured to divide the sampling clock signal by an adjustable divisor to form a divided clock signal;
a selector circuit configured to set the adjustable divisor to equal to a first divisor responsive to the divided clock signal not being locked with the serial data stream and to set the adjustable divisor to equal a second divisor responsive to the divided clock signal being locked to the serial data stream, wherein the second divisor is greater than the first divisor;
a phase detector configured to compare the divided clock signal to the serial data stream to form a phase detector output signal; and
a loop filter configured to filter the phase detector output signal to form a filtered phase difference, wherein the mixer is further configured to phase shift the input clock signal responsive to the filtered phase difference.
2. The receiver of claim 1, further comprising:
a quadrature mixer configured to phase shift a quadrature (Q) version of the input clock signal to form a Q version of the sampling clock signal, wherein the mixer is an in-phase mixer configured to phase shift an in-phase version of the input clock signal to form the sampling clock signal.
3. The receiver of claim 1, wherein the clock divider is further configured to divide a quadrature version of the sampling clock signal to form a quadrature divided clock signal.
4. The receiver of claim 1, further comprising:
a clock data recovery (CDR) lock detector configured to assert a lock detection signal responsive to the phase detector output signal to indicate when the divided clock signal is locked to the serial data stream, wherein the selector circuit is configured to set the adjustable divisor equal to the second divisor responsive to the assertion of the lock detection signal and to set the adjustable divisor equal to the first divisor responsive to a de-assertion of the lock detection signal.
5. The receiver of claim 1, further comprising a glitch prevention circuit configured to prevent glitches in the divided clock signal.
6. The receiver of claim 1, further comprising an equalizer for equalizing a received data stream to form the serial data stream.
7. The receiver of claim 1, further comprising a clock recovery circuit configured to recover the input clock signal from the serial data stream.

8. The receiver of claim 1, wherein the input clock signal is a source synchronous input clock signal.

9. The receiver of claim 1, wherein the input clock signal comprises an in-phase input clock signal and a quadrature input clock signal.

10. A method of receiving a serial data stream, comprising;
  phase shifting an input clock signal to form a sampling clock signal;
  dividing the sampling clock signal by an adjustable divisor to form a divided clock signal, wherein the phase shifting of the input clock signal is responsive to a phase difference between the divided clock signal and the serial data stream;
  setting the adjustable divisor to equal a first divisor responsive to the divided clock signal is not being locked to the serial data stream;
  setting the adjustable divisor to equal a second divisor responsive to the divided clock signal being locked to the serial data stream, wherein the second divisor is greater than the first divisor;
  sampling the serial data stream according to the sampling clock signal;
  detecting a phase difference between the divided clock signal and the serial data stream to form a phase detector output signal; and
  filtering the phase detector output signal to form a filtered phase difference signal, wherein the phase shifting of the input clock signal is responsive to the filtered phase difference signal.

11. The method of claim 10, further comprising recovering the input clock signal from the serial data stream.

12. The method of claim 10, further comprising receiving the input clock signal as a source synchronous input clock signal in parallel with the serial data stream.

13. The method of claim 10, wherein forming the phase detector output signal comprises asserting either an UP signal or a DOWN signal.

14. The method of claim 10, wherein phase shifting the input clock signal comprises shifting an in-phase version of the input clock signal to form the sampling clock signal.

15. The method of claim 10, further comprising equalizing a received serial data stream to form the serial data stream.

16. A receiver, comprising;
  a mixer configured to phase shift an input clock signal to form a sampling clock signal;
  a de-serializer configured to sample a serial data stream responsive to the sampling clock signal to form a parallel output data stream;
  a clock divider configured to divide the sampling clock signal by an adjustable divisor to form a divided clock signal; and
  means for adjusting the adjustable divisor to equal a first divisor responsive to the divided clock signal not being locked with the serial data stream and for adjusting the adjustable divisor to equal a second divisor responsive to the divided clock signal being locked to the serial data stream.

17. The receiver of claim 16, wherein the means comprises a multiplexer.

18. The receiver of claim 16, further comprising a clock recovery circuit configured to recover the input clock signal from the serial data stream.

* * * * *